United States Patent [19]

Nelson, III

[11] Patent Number: 4,929,902
[45] Date of Patent: May 29, 1990

[54] MULTIPLE SIZE CABLE TESTING DEVICE

[76] Inventor: William A. Nelson, III, R.D. 1, Box 300, Old York Rd., Ringoes, N.J. 08551

[21] Appl. No.: 334,729

[22] Filed: Apr. 7, 1989

[51] Int. Cl.$^5$ .......................................... G01R 31/02
[52] U.S. Cl. .................................. 324/542; 324/527; 324/556; 324/133
[58] Field of Search ............... 324/542, 539, 541, 527, 324/556, 133, 66, 73 R; 379/26

[56] References Cited

U.S. PATENT DOCUMENTS

| | | | |
|---|---|---|---|
| 2,810,881 | 10/1957 | Daily | 324/542 |
| 3,778,801 | 12/1973 | Nudelmont | 324/542 |
| 4,204,154 | 5/1980 | Rosier et al. | 324/539 X |
| 4,207,517 | 10/1980 | Bloxam | 324/542 |
| 4,385,272 | 5/1983 | Whitehead | 324/542 |
| 4,418,312 | 11/1983 | Figler et al. | 324/542 |
| 4,471,293 | 9/1984 | Schnack | 324/542 |
| 4,550,287 | 10/1985 | Babcock | 324/542 |
| 4,553,085 | 11/1985 | Canzano | 324/542 |
| 4,670,709 | 6/1987 | Iredale | 324/133 X |
| 4,756,017 | 7/1988 | Bush | 379/26 X |
| 4,839,599 | 6/1989 | Fisher | 324/542 |

*Primary Examiner*—Reinhard J. Eisenzopf
*Assistant Examiner*—Robert W. Mueller
*Attorney, Agent, or Firm*—Kenneth P. Glynn

[57] ABSTRACT

The present invention is directed to a multisize coaxial cable testing device having a housing, a transmitter-analyzer unit and a receiver unit. The transmitter-analyzer unit is located in the housing and includes an on/off switch, a power source, wiring, a circuit board with resistors to regulate current flow, and three or more different size three-wire coaxial cable connectors. The transmitter-analyzer unit also includes at least two signal lights and the power source is connected to each of the cable connectors through the circuit board and wiring. The signal lights are also connected to the wiring to signal the malfunction of a particular wire of a three-wire coaxial cable when tested. The receiver unit receives current from the transmitter-analyzer unit and returns current to the transmitter-analyzer unit. The receiver unit has three or more different size three-wire coaxial cable connectors of the size and type as the connectors of the transmitter-analyzer unit. These diodes and resistors via the wiring are connected to the three-wire cable connectors so as to complete a circuit for testing in conjunction with said transmitter-analyzer unit when the on/off switch is on and a plug at one end of a cable to be tested is connected to a connector of said transmitter unit and the plug at the opposite end of cable to be tested is connected to a connector of said receiver unit.

20 Claims, 2 Drawing Sheets

MULTIPLE SIZE CABLE TESTING DEVICE

BACKGROUND OF THE INVENTION

1. Field of the Invention

This invention relates to coaxial cable testing devices and more specifically to devices capable of testing different size cables. It is also directed to the problem of testing long cables and difficult to move cables wherein heretofore opposite ends of such cables may have been brought into close proximity to one another to be both plugged into a single testing unit or device for testing.

2. Prior Art Statement

Coaxial cables are used extensively in radio and television studios, on movie sets, in musical concerts and recording studios, in multimedia tie-ins, in computer and data transmissions and in networking as well as in cable television systems, etc. These cables may be damaged through production errors, shipping damage, impact and the like, and the need for coaxial cable testing has become very important in these and other industries.

U.S. Pat. No. 4,553,085 issued to Canzano in 1985 describes a coaxial cable tester device using a transmitter unit and a receiver unit which may be used at different locations. However, a single unit may be used alone to test a looped cable or it may be used in conjunction with the other unit. This invention requires complex wiring and housing for both the transmitter and the receiver and requires four jacks or connectors for a single size cable and is not capable of testing different size cables.

U.S. Pat. No. 2,810,881 to Daily and No. 4,385,272 to Whitehead describe cable testers which require that both ends of a cable to be tested be inserted into connectors in a single housing, test only one size unit, and require relatively complex wiring. U.S. Pat. Nos. 3,778,801 to Nudelmont, 4,207,517 to Bloxam, 4,418,312 to Figler et al and 4,471,293 to Schnack all describe complex systems for multiconductor cable or multifunction testing, involving complex circuitry and apparatus. U.S. Pat. No. 4,550,287 to Babcock describes a multifunction data bus tester using tricolored LED signalling.

Notwithstanding the developments shown by the cited prior art, there appear to be no simple hand held testers taught which provide the advantages of inexpensive wiring, the ability to test different size cables and the ability to test a lengthy cable without bringing both ends of that cable into close proximity with one another.

SUMMARY OF THE INVENTION

The present invention is directed to a multi-size coaxial cable testing device having a housing, a transmitter-analyzer unit and a receiver unit. The transmitter-analyzer unit is located in the housing and includes an on/off switch, a power source, wiring, a circuit board with resistors to regulate current flow, and three or more different size three-wire coaxial cable connectors. One of these cable connectors is for receiving a plug at one end of a first cable of a defined size, one cable connector for receiving a plug of a second cable of a different defined size, and one cable connector for receiving a microphone cable plug of a size different from those of said first and second cables. The transmitter-analyzer unit also includes at least two signal lights and the power source is connected to each of the cable connectors through the circuit board and wiring. The signal lights are also connected to the wiring to signal the malfunction of a particular wire of a three-wire coaxial cable when tested. The receiver unit receives current from the transmitter-analyzer unit (via the cable to be tested) and returns current to the transmitter-analyzer unit (via the cable to be tested). Thus, the receiver unit has three or more different size three-wire coaxial cable connectors of the same size and type as the connectors of the transmitter-analyzer unit, as well as wiring and diodes and/or resistors. These diodes and resistors via the wiring are connected to the three-wire cable connectors so as to complete a circuit for testing in conjunction with said transmitter-analyzer unit when the on/off switch is on and a plug at one end of a cable to be tested is connected to a connector of said transmitter unit and the plug at the opposite end of cable to be tested is connected to a connector of said receiver unit.

BRIEF DESCRIPTION OF THE DRAWINGS

The present invention will be more fully understood when the present specification is taken in conjunction with the appended drawings wherein.

DETAILED DESCRIPTION OF THE PRESENT INVENTION

Figure 1:
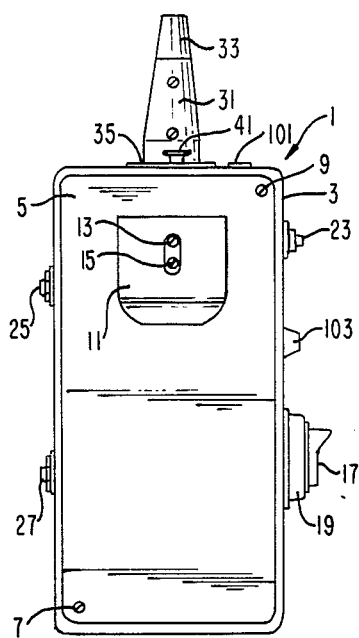
FIG. 1 illustrates a back view of a preferred embodiment device of the present invention showing side jacks and showing a removable receiver component.
Figure 2:
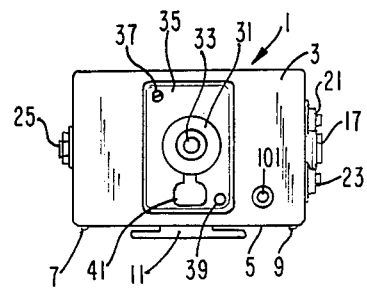
FIG. 2 shows a top view of the device of FIG. 1.

Referring now to FIGS. 1 and 2, there is shown a multiple size coaxial cable testing device, hereinafter device 1, leaving an elongated, open-backed housing 3, with backplate 5 held on by screws 7 and 9. Housing 3 may be constructed of light metal or plastic and may be accessible via an alternative top, front, bottom or sideplate and may be attached by screws, clips, rivets, glue, weld or any other conventional means. FIG. 1 shows device 1 from its back view to show the functional aspects of the back, top and both sides, and FIG. 2 shows top view details.

Device 1 contains a transmitter-analyzer unit and a receiver unit (not shown in the Figures) discussed further in detail in conjunction with FIG. 6 below which enable device 1 to be used for testing the functionality and polarity of three or more different size cables each of which have three wires. The cables to be tested are connected to device 1 at both of its ends and light signals define whether or not there is a short or a reversal, enabling the tester to exactly identify a problem.

Thus FIGS. 1 and 2 show optional belt clip 11 held onto backplate 5 by screws 13 and 15, to enable the user to wear the device when not in use. On/off switch 17 in encasement 19 allows the user to turn on the power for testing any size cable which device 1 will receive. Switch 17 completes a portion of a circuit for power, and the cable to be tested, when fully connected to device 1, completes another portion of a circuit to complete a test loop for that cable. In this embodiment, "RCA" type, i.e. ⅛ inch cable, jack 21 and 23 are shown extending from the side of housing 3. When both ends of an "RCA" cable are plugged into connector jacks 21 and 23, and switch 17 is turned on, a test loop circuit is completed and tricolor (e.g. red, green, clear) lights 103 and 105 illuminate to indicate and identify a problem, if there is one. While connector jacks 21 and 23 are sized for purposes of illustration for ⅛ inch cable, they could be sized for any known triple wire cable.

Figure 3:
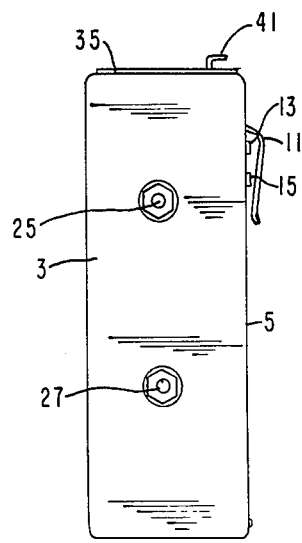
FIG. 3 shows a right side view of the device of FIG. 1 but with the removable receiver component removed therefrom.

Referring to FIG. 3, connector jacks 25 and 27 are set up here to ¼ inch plug cable; any second size different from the size cable of connector jacks 21 and 23 may be used. Also, these connector jacks 25 and 27 function in the same manner as described for connector jacks 21 and 23 but for a different size cable.

Figure 4:
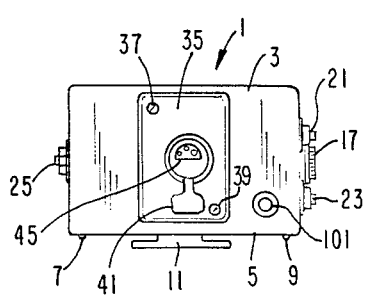
FIG. 4 shows a top view of the device of FIG. 3 exposing a microphone cable jack.

FIGS. 1 and 2 also show connector 31 with cap 33 which contains a receiving jack inside which is the same as connector jack 45 shown in FIG. 4. Connector 31 is removably connected to the device 1 housing 3 via plate 35, screws 37 and 39 and release button 41. FIG. 4 shows the top view of device 1 with connector 31 removed to show individual prong openings located on connector jack 45. The connector 31 and the connector jack 45 receive opposite ends of a cable such as those mentioned above or such as the preferred microphone cable. Thus, using connector 31 to remotely plug in one end of a cable and connector jack 45 to plug in the other end of a cable, a cable may be tested without substantially moving it or bringing opposite ends within close proximity to one another. This is particularly useful where cables are anchored or permanently installed and the ends cannot be brought close together and where cables are covered by many criss-crossing cables such as at a set up for a band concert, and the ends cannot be easily brought together. Also, when used by two operators, an entire series of cables may be efficiently and relatively quickly tested.

Figure 5:
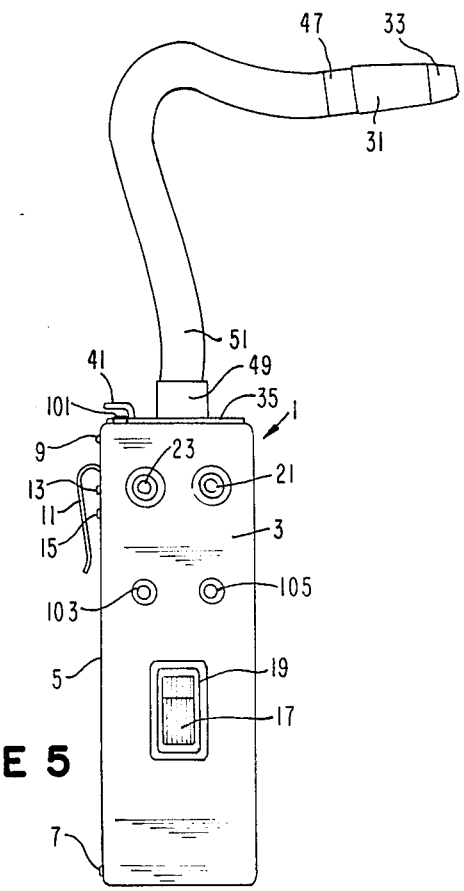
FIG. 5 illustrates a left side view of the device of FIG. 1 but includes a microphone cable to be tested connected thereto.

FIG. 5 shows device 1 with cable 51 connected thereto. Plus 47 and 49 of cable 51 are respectively connected to connector 31 and connector jack 45. When switch 17 is turned on, power passes through cable 51 and returns via connector 31 to the jack 45 and into the housing. Circuitry discussed below will signal failure, if any, via LED lights 103 and 105.

For simplifying the functional aspects of device 1, the operating parts are viewed as making up two different units, i.e., a transmitter-analyzer unit ("T.A.U.") and a receiver unit ("R.U."). Referring now to FIG. 6, there is a schematic diagram of the wiring and circuitry of one embodiment of the present invention. The R.U. consists of connector jacks 23,27 and 31 from the Figures above and here illustrated as circles, as well as the permanent wiring and resistors and/or diodes connected directly thereto. All of the remaining circuitry, components, wiring and jacks make up the T.A.U.

Figure 6:
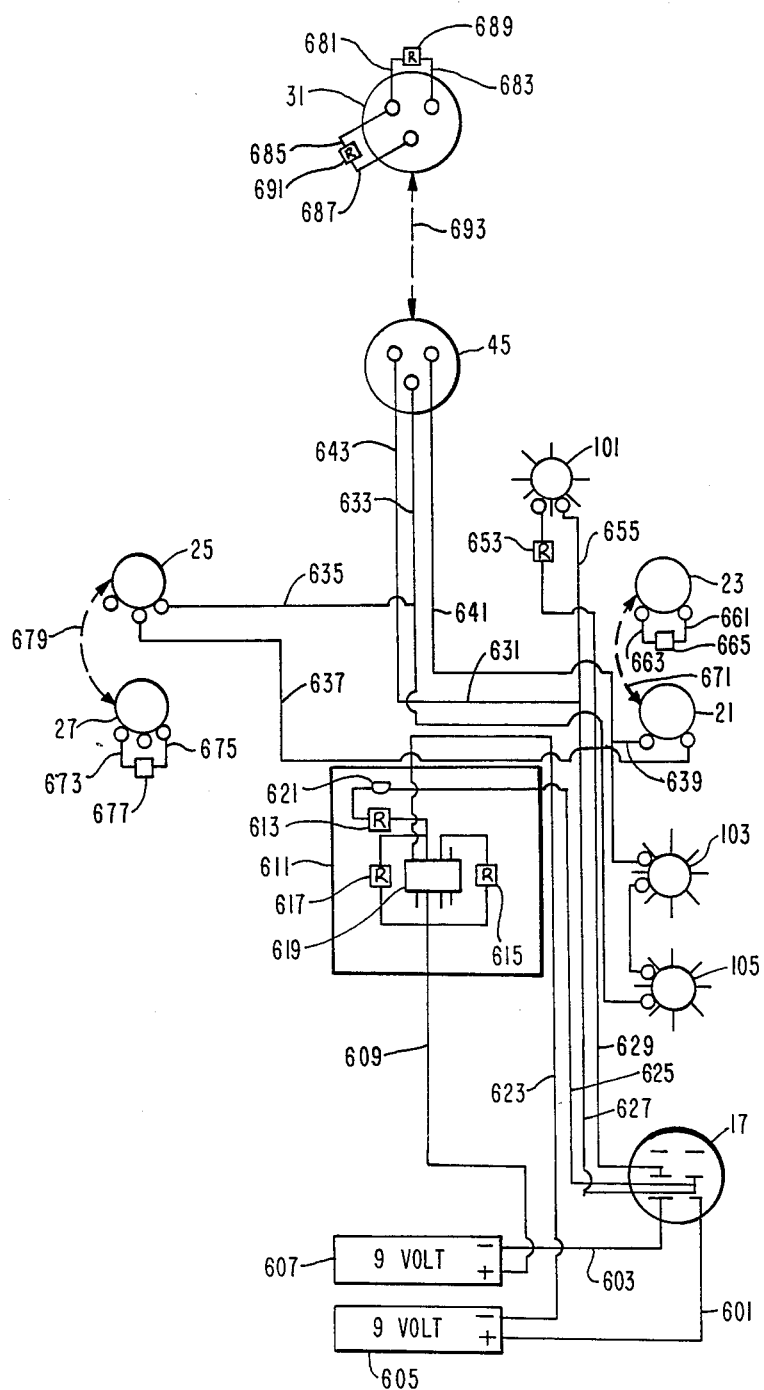
FIG. 6 shows a schematic diagram of the electrical components and wiring of a present invention device.

Thus, in FIG. 6, the T.A.U. includes on/off switch 17 which is wired via 601 and 603 to batteries 605 and 607, as shown. In turn the batteries 605 and 607 (hereinafter "power source") are connected via wire 609 to circuit board 611. This has resistors 613, 615 and 617, 8 pin dip and socket 619 and tantalum capacitor 621. Circuit board components are then connected via wire 623 back to the power source and to switch 17 via wire 625. The switch 17 is connected back to different size connector jacks 21,25 and 45, as shown, with wires which pass through connector jack 45. Thus wires 627, 631, 633, 635, 637, 639, 641, 643 are connected to one another and the component connector jacks 21,25 and 45 as shown. Likewise, switch 17 is connected to on/off power indicator light 101 via wire 629 and resistor 653 and wire 655 and 627. In this embodiment connector 31 from the R.U. must be inserted into connector jack 45 to partially complete the circuit for the other jacks 21 and 25, as shown. Alternatively, wiring for the connector jacks 21 and 25 could by-pass connector jack 45 and readily function in the same manner. Signal lights 103 and 105 are tricolor LED's but could be bicolored if more were used or even single colored with off-on signaling. In this particular embodiment, they are white, red, green tricolor and may illuminate in one or more colors.

Referring now back to the R.U. of FIG. 6, connector jack 23 includes wires 661 and 663 with diode 665 therebetween. When a three-wired coaxial cable such as a ⅛ inch cable 671 (dotted line) is plugged into connector jack 23 and into its T.A.U. corresponding opposite connector jack 21, the circuit for testing is completed when switch 17 is turned on. Likewise, the R.U. also includes connector jack 27, wires 673 and 675 and diode 677 which operate on a cable to be tested, e.g. cable 679 (dotted line) in the same manner as connector jack 23 and its wires and diode, as described above. Last, the R.U. also includes removable connector 31 which includes wires 681, 683, 685, 687 and reistors 689 and 691. When connector 31 and connector jack 45 are connected to opposite ends of cable 693 (dotted line), and switch 17 is turned on, the circuit is completed and testing is accomplished.

The exact resistor, diode and capacitor specifications are within the purview of the electronics artisan to create appropriate thresholds to show functioning/non-functioning of cables being tested. To illustrate the functioning, the following Table 1 may be used in conjunction with device 1 of the Figures and with the device 1 constructed electrically in accordance with FIG. 6. In Table 1, the symbols having the following meanings:

G=Green; R=Red; W=White; and the numbers designate a wire 1, 2, or 3 in the cable being tested:

TABLE 1

| G G = OK |
| --- |
| R R = #1 OK 2&3 REV. |
| W W = #1 OPEN |
| RG RG = #1 OK 2&3 SHORT OR ALL SHORT |
| RG W = #2 OK 1&3 SHORT OR SHIELD TO 3 |
| W RG = #3 OK 1&2 SHORT OR SHIELD TO 2 |
| R W = #1 OK 2 ON 3 3 OUT |
| W R = #1 OK 3 ON 2 2 OUT |
| G W = #1 OK 2 OPEN 3 OK |
| W G = #1 OK 2 OK 3 OPEN |

The color code chart of Table 1 is merely exemplary of the type of signalling that may be used to indicate cable problems. The numerals 1, 2 and 3 may represent, for example, hot, neutral and ground wires and the Table identifies which wire is faulty. Other types of codes would be within the purview of the present invention. Actual devices identical to that of the Figures using the physical and electrical arrangements shown have successfully and advantageously been utilized in actual field situations in commercial environments.

Clearly, many modifications and variations of the present invention may be made without exceeding its scope. For example, belt clip 11 shown in FIGS. 1 through 4 is optional; the flat front may have connector plugs located thereon, etc. The artisan may readily adapt other variations and it is therefore understood that the scope of the appended claims may be practiced otherwise than as specifically described.

What is claimed is:

1. A multiple size coaxial cable testing device for signaling the malfunction of a particular wire of a three wire coaxial cable, which comprises:
   (a) a housing;
   (b) a transmitter-analyzer unit located in said housing which contains:
      (i) an on/off switch;
      (ii) a power source;
      (iii) wiring;
      (iv) a circuit board with resistors to regulate current flow;
      (v) three or more different size, three-wire coaxial cable connectors, including one cable connector for receiving a plug at one end of a first cable of a defined size, one cable connector for receiving a plug at one end of a second cable of a different defined size, and one cable connector for receiving a microphone cable plug of a size different from those of said first and said second cables; and,
      (vi) at least two signal lights; wherein said power source is connected to each of said cable connectors through said circuit board via said wiring, and said signal lights are connected to the wiring to signal the malfunction of a particular wire of a three-wire coaxial cable when tested; and,
   (c) a receiver unit for receiving current from the transmitter-analyzer unit and returning current to it when a cable is tested, said receiver unit located at least in part in said housing, which receiver unit contains:
      (i) three or more different size, three-wire coaxial cable connectors of the same type and size as the connectors of said transmitter-analyzer, at least one of said cable connectors being removably attached to said housing for connection to the opposite end of a cable to be tested;
      (ii) each of said connectors having wiring; and,
      (iii) diodes and/or resistors;
      wherein said diodes and/or resistors are connected via said wiring to the three-wire cable connectors so as to complete a circuit for testing in conjunction with said transmitter-analyzer unit when the on/off switch is on and a plug at one end of a cable to be tested is connected to a connector of said transmitter unit and the plug at the opposite end of cable to be tested is connected to a connector of said receiver unit.

2. The multiple size coaxial cable testing device of claim 1 wherein said removably attached cable connector is a microphone connector of the male type to enable the device to host one end of a microphone cable to be tested and to enable the removable cable connector to be plugged into the opposite end of the microphone cable thereby enabling a microphone cable to be tested without both ends having to be brought to close proximity at a single test location.

3. The device of claim 2 wherein said removable cable connector completes circuitry in the device when it is attached to the device so as to enable testing of a cable other than a microphone cable with said device.

4. The device of claim 3 wherein said receiving unit cable connector for a microphone cable has wiring with resistors which connect individual cable wires to one another when hosting one end of a microphone cable.

5. The device of claim 2 wherein said removable cable connector is independent of circuitry of the device necessary to the testing of a cable other than a microphone cable.

6. The device of claim 4 wherein said receiver unit cable connector for a microphone cable has wiring with resistors which connect individual cable wires to one another when hosting one end of a microphone cable.

7. The device of claim 2 wherein said receiver unit cable connector for a microphone cable has wiring with resistors which connect individual cable wires to one another when hosting one end of a microphone cable.

8. The device of claim 2 wherein said receiver unit removable cable connector is a ¼ inch cable plug connector.

9. The device of claim 2 wherein all of the cable connectors of the receiver unit are removably attached to said housing.

10. The device of claim 2 wherein said receiver unit removable cable connector is an RCA or ⅛ inch cable plug connector.

11. The device of claim 2 wherein said first cable is a ¼ inch cable and said second cable is a ⅛ inch cable.

12. The device of claim 1 wherein said receiver unit cable connector for a microphone cable has wiring with resistors which electrically connect individual cable wires to one another when hosting one end of a microphone cable.

13. The device of claim 1 wherein said receiver unit removable cable connector is a ¼ inch cable plug connector.

14. The device of claim 1 wherein all of the cable connectors of the receiver units are removably attached to said housing.

15. The device of claim 1 wherein said receiver unit removable cable connector is an RCA or ⅛ inch cable plug connector.

16. The device of claim 1 wherein said lights are LEDs.

17. The device of claim 16 wherein an LED light code defining the meaning of various light color combinations is attached to said housing.

18. The device of claim 1 wherein said first cable is a ¼ inch cable and said second cable is a ⅛ inch cable.

19. The device of claim 1 wherein an on/off indicator light is contained on the outside of said housing and is connected to the wiring and the on/off switch to visibly indicate whether or not the device is turned on.

20. A multiple size coaxial cable testing device for signaling the malfunction of a particular wire of a three wire coaxial cable, which comprises:
   (a) a housing;
   (b) a transmitter-analyzer unit located in said housing which contains:
      (i) an on/off switch;
      (ii) a power source;
      (iii) wiring;
      (iv) a circuit board with resistors to regulate current flow;
      (v) three or more different size, three-wire coaxial cable connectors, including one cable connector for receiving a plug at one end of a first cable of a defined size, one cable connector for receiving a plug at one end of a second cable of a different defined size, and one cable connector for recieiving a microphone cable plug of a size different from those of said first and second cables; and, (vi) at least two tri-color LED signal lights;

wherein said power source is connected to each of said cable connectors through said circuit board via said wiring, and said signal lights are connected to the wiring to signal the malfunction of a particular wire of a three-wire coaxial cable when tested; and, (c) a receiver unit for receiving current from the transmitter-analyzer unit and returning current to it when a cable is tested, said receiver unit located at least in part in said housing, which receiver unit contains:

(i) three or more different size, three-wire coaxial cable connectors of the same type and size as the connectors of said transmitter-analyzer, at least one of said cable connectors being removably attatched to said housing for connection to the opposite end of a cable to be tested;

(ii) each of said connectors having wiring; and, (iii) diodes and/or resistors;

wherein said diodes and/or resistors are connected via said wiring to the three-wire cable connectors so as to complete a circuit for testing in conjunction with said transmitter-analyzer unit when the on/off switch is on and a plug at one end of a cable to be tested is connected to a connector of said transmitter unit and the plug at the opposite end of cable to be tested is connected to a connector of said receiver unit.

* * * * *